(12) United States Patent
Ikari et al.

(10) Patent No.: US 10,984,988 B2
(45) Date of Patent: Apr. 20, 2021

(54) METHOD OF MANUFACTURING RING-SHAPED MEMBER AND RING-SHAPED MEMBER

(71) Applicant: THINKON NEW TECHNOLOGY JAPAN CORPORATION, Tokyo (JP)

(72) Inventors: Atsushi Ikari, Shunan (JP); Satoshi Fujii, Tokyo (JP)

(73) Assignee: THINKON NEW TECHNOLOGY JAPAN CORPORATION, Tokyo (JP)

( * ) Notice: Subject to any disclaimer, the term of this patent is extended or adjusted under 35 U.S.C. 154(b) by 257 days.

(21) Appl. No.: 16/307,849

(22) PCT Filed: Mar. 7, 2018

(86) PCT No.: PCT/JP2018/008870
§ 371 (c)(1),
(2) Date: Dec. 6, 2018

(87) PCT Pub. No.: WO2018/211788
PCT Pub. Date: Nov. 22, 2018

(65) Prior Publication Data
US 2019/0259581 A1 Aug. 22, 2019

(30) Foreign Application Priority Data

May 19, 2017 (JP) .............................. JP2017-100173

(51) Int. Cl.
*B29C 65/00* (2006.01)
*H01J 37/32* (2006.01)
(Continued)

(52) U.S. Cl.
CPC ........ *H01J 37/32642* (2013.01); *C30B 29/06* (2013.01); *C30B 33/06* (2013.01);
(Continued)

(58) Field of Classification Search
CPC ........... H01L 21/3065; H01L 21/67069; H01L 24/03; H01J 37/32642; H01J 37/32807; C30B 29/06; C30B 33/06
(Continued)

(56) References Cited

U.S. PATENT DOCUMENTS

| 2008/0236752 | A1 | 10/2008 | Honda | |
| 2010/0116436 | A1* | 5/2010 | Kitajima | H01J 37/3255 156/345.1 |
| 2014/0110057 | A1* | 4/2014 | Lee | C23F 1/08 156/345.3 |

FOREIGN PATENT DOCUMENTS

| JP | H07-298463 | 11/1995 |
| JP | 2003-257807 | 9/2003 |

(Continued)

OTHER PUBLICATIONS

Bean, J.C. et al, Epitaxial laser crystallization of thin-film amorphous silicon, Applied Physics Letters, Aug. 1, 1978, vol. 33, No. 3, pp. 227-230.
(Continued)

*Primary Examiner* — Brook Kebede
(74) *Attorney, Agent, or Firm* — Wentsler LLC

(57) ABSTRACT

Provided are a method of manufacturing a ring-shaped member and the ring-shaped member. A method of manufacturing a ring-shaped member to be placed in a process chamber of a substrate processing apparatus includes arranging one silicon member and another silicon member to cause one abutting surface of the one silicon member and another abutting surface of the other silicon member to abut on each other, heating the one abutting surface and the other abutting surface through optical heating to melt silicon on a surface of the one abutting surface and silicon on a surface of the other abutting surface such that silicon melt is caused to flow into a gap between the one abutting surface and the other
(Continued)

abutting surface, and cooling the one abutting surface and the other abutting surface to crystallize the silicon melt forming a silicon adhesion part.

3 Claims, 8 Drawing Sheets

(51) Int. Cl.
  *C30B 29/06*    (2006.01)
  *H01L 21/67*    (2006.01)
  *H01L 21/3065*    (2006.01)
  *C30B 33/06*    (2006.01)
  *H01L 23/00*    (2006.01)

(52) U.S. Cl.
  CPC .... *H01J 37/32807* (2013.01); *H01L 21/3065* (2013.01); *H01L 21/67069* (2013.01); *H01L 24/03* (2013.01); *H01J 2237/3341* (2013.01)

(58) Field of Classification Search
  USPC .......................................... 156/272.6, 345.3
  See application file for complete search history.

(56)        References Cited

FOREIGN PATENT DOCUMENTS

| | | |
|---|---|---|
| JP | 2008-251744 | 10/2008 |
| JP | 2010-114313 | 5/2010 |

OTHER PUBLICATIONS

International Search Report dated May 15, 2018 in International Application No. PCT/JP2018/008870.

Notification of Reason for Refusal in Korea dated Feb. 26, 2020 for application No. 10-2018-7034663.

* cited by examiner

METHOD OF MANUFACTURING RING-SHAPED MEMBER AND RING-SHAPED MEMBER

TECHNICAL FIELD

The present invention relates to a method of manufacturing a ring-shaped member, and to the ring-shaped member.

BACKGROUND ART

A dry etching apparatus using plasma is used as substrate processing apparatuses in manufacture of a semiconductor integrated device such as an LSI. The dry etching apparatus includes a cylindrical vacuum chamber. A high-frequency voltage is applied between a cathode of a planar electrode and a counter electrode (anode) by a high-frequency oscillator while a wafer to be etched is placed on the cathode and etching gas is introduced into the vacuum chamber, thereby plasma of the etching gas is generated between the electrodes. Positive ions as activated gas in the plasma enter a surface of the wafer to etch the wafer.

Various ring-shaped members are used inside the vacuum chamber of the dry etching apparatus. Representative examples of the ring-shaped member include a focus ring that has a doughnut shape surrounding the wafer to be etched, and an annular ground ring that is disposed so as to cover a side surface of a columnar susceptor base portion on which the wafer is placed. The representative examples of the ring-shaped member further include a protection member such as an annular shield ring provided on a peripheral edge part of the counter electrode, and a side wall member covering an inner wall side surface of the vacuum chamber (Patent Literature 1).

When there is a metal component inside the vacuum chamber of the dry etching apparatus, metal contamination occurs. Therefore, a silicon component is desirably used. It is necessary for each of the focus ring, the ground ring, and the ring-shaped protection member to have a diameter larger than a diameter of the wafer to be etched. A silicon component for 300 mm wafer, which is mainly in current use, is expensive because the silicon component is fabricated from a silicon crystal ingot having a diameter of 320 mm or more. In particular, some of the ring-shaped side wall members have a diameter of 700 mm or more, and it is substantially impossible in some cases to fabricate the ring-shaped side wall member from a silicon crystal ingot.

CITATION LIST

Patent Literature

Patent Literature 1: Japanese Patent Laid-Open No. 2008-251744

SUMMARY OF INVENTION

Technical Problem

If the silicon component is manufactured by joining a plurality of silicon members not as an integrated component, the silicon component is fabricable from a silicon crystal ingot that has a smaller diameter. Therefore, various advantages such as manufacturing cost reduction are expected.

An object of the present invention is to provide a method of manufacturing a ring-shaped member in which a plurality of silicon members are joined, and the ring-shaped member.

Solution to Problem

A method of manufacturing a ring-shaped member according to the present invention is a method of manufacturing a ring-shaped member to be placed in a process chamber of a substrate processing apparatus that performs plasma processing on a substrate accommodated in the process chamber, and the method includes: arranging one silicon member and another silicon member to cause one abutting surface of the one silicon member and another abutting surface of the other silicon member to abut on each other; heating the one abutting surface and the other abutting surface through optical heating by a xenon lamp or a halogen lamp to melt silicon on a surface of the one abutting surface and silicon on a surface of the other abutting surface such that silicon melt is caused to flow into a gap between the one abutting surface and the other abutting surface; and cooling the one abutting surface and the other abutting surface to crystallize the silicon melt forming a silicon adhesion part such that the one silicon member and the other silicon member are joined to each other with the silicon adhesion part.

A ring-shaped member according to the present invention is a ring-shaped member to be placed in a process chamber of a substrate processing apparatus that performs plasma processing on a substrate accommodated in the process chamber, and the ring-shaped member includes a plurality of silicon members, and a silicon adhesion part that is provided to fill a gap between one abutting surface of one of the silicon members and another abutting surface of another one of the silicon members, and joins the one abutting surface and the other abutting surface. The silicon adhesion part is made from silicon melt at an end surface of the one silicon member and silicon melt at an end surface of the other silicon member to come into contact with each other that have flown into the gap due to capillary phenomenon and have been crystallized, wherein one silicon adhesion part made of monocrystalline silicon taking over crystallinity of the one abutting surface and another silicon adhesion part made of monocrystalline silicon taking over crystallinity of the other abutting surface are integrated at atomic level.

Advantageous Effects of Invention

According to the present invention, it is possible to manufacture the ring-shaped member by combining the plurality of silicon members each cut out from a silicon crystal ingot that has a size smaller than an outer diameter of the ring-shaped member. Accordingly, for the ring-shaped member, it is unnecessary to use the silicon crystal ingot that has a size larger than the outer diameter of the ring-shaped member, and thus the cost can be reduced accordingly.

BRIEF DESCRIPTION OF DRAWINGS

FIG. 8 is a cross-sectional view illustrating an abutting surface according to the second embodiment, where

FIG. 9 is a perspective view illustrating a ring-shaped member according to a third embodiment, where

FIG. 10 is a cross-sectional view illustrating an abutting surface according to the third embodiment, where

FIG. 11 is a diagram illustrating an embedded silicon member, where

DESCRIPTION OF EMBODIMENTS

Some embodiments of the present invention are described in detail below with reference to drawings.

1. First Embodiment (1) Entire Configuration

Figure 1:
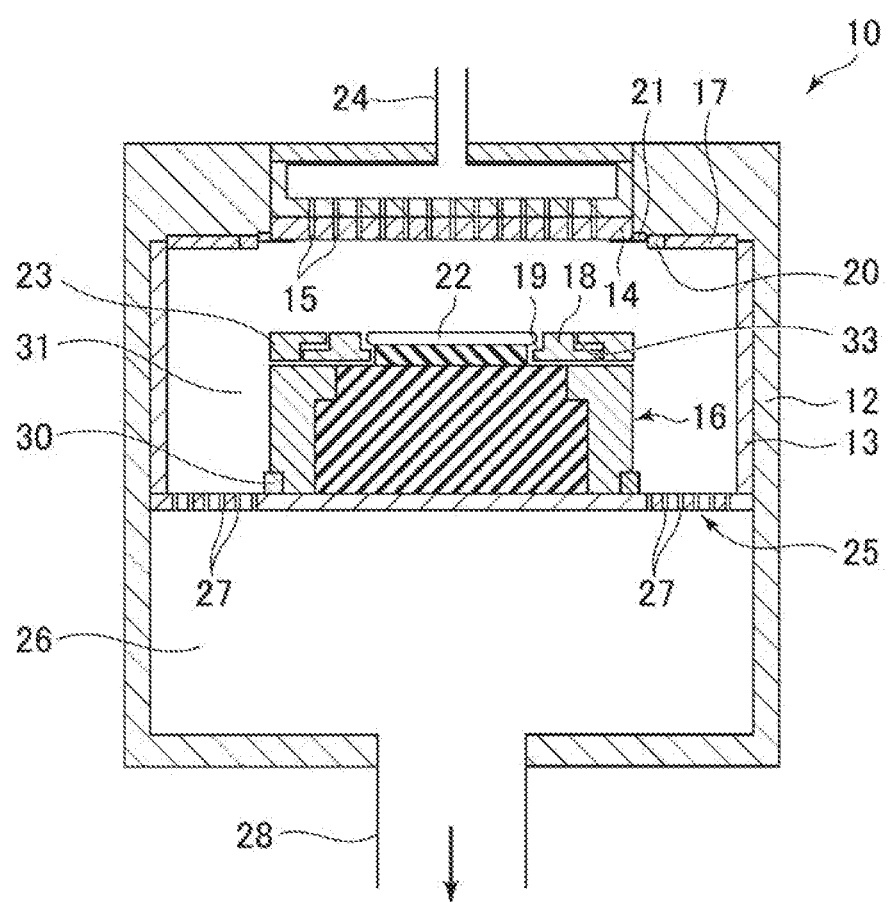
FIG. 1 is a cross-sectional view schematically illustrating a configuration of a dry etching apparatus provided with a focus ring that is fabricated from a ring-shaped member according to a first embodiment.

A dry etching apparatus 10 illustrated in FIG. 1 includes a vacuum chamber 12 as a process chamber, an upper electrode plate 14, and a base 16. The vacuum chamber 12 has a substantially cylindrical shape, and internally includes a process space 31 surrounded by a cylindrical side wall. An inner surface of the side wall of the vacuum chamber 12 is covered with a side wall member 13. An inner surface around the upper electrode plate 14 on an upper wall of the vacuum chamber 12 is covered with an upper wall member 17. The side wall member 13 and the upper wall member 17 are annular members to protect the inner wall of the vacuum chamber 12 exposed to plasma, and are made of silicon.

A baffle plate 25 is provided inside the vacuum chamber 12 that partitions the inside of the vacuum chamber 12 in a height direction. An exhaust space 26 is provided on a lower part inside the vacuum chamber 12 partitioned by the baffle plate 25, and the process space 31 is provided on an upper part inside the vacuum chamber 12. The baffle plate 25 is a protection member to prevent backflow of etching gas, and is made of silicon. The baffle plate 25 includes an annular main body, and includes flow passages 27 that penetrate through the main body in a thickness direction. As illustrated in the figure, the baffle plate 25 is provided at a substantially center in the height direction inside the vacuum chamber 12.

The upper electrode plate 14 is a disc-like member, and is fixed to the upper part inside the vacuum chamber 12. A peripheral edge part of the upper electrode plate 14 is covered with a protection ring 20. A shield ring 21 made of quartz is provided between the upper electrode plate 14 and the protection ring 20. The protection ring 20 is a member to protect the inner wall of the vacuum chamber 12 from the plasma generated near the upper electrode plate 14, and is made of silicon. The protection ring 20 is grounded in some cases. In the figure, a surface of the protection ring 20 on the inside of the vacuum chamber 12 protrudes from the shield ring 21, and has the same height as the height of the upper wall member 17. The upper electrode plate 14 includes a plurality of through holes 15 penetrating through the upper electrode plate 14 in a thickness direction. The upper electrode plate 14 is electrically connected with an unillustrated high-frequency power supply. The upper electrode plate 14 is connected with a gas supply pipe 24.

The etching gas supplied through the gas supply pipe 24 flows into the vacuum chamber 12 from the through holes 15 of the upper electrode plate 14. The etching gas flowed into the vacuum chamber 12 flows into the exhaust space 26 through the flow passages 27, and is exhausted to outside from an exhaust port 28.

The base 16 is disposed inside the process space 31 on the upper side of the baffle plate 25 inside the vacuum chamber 12, and is surrounded by a ground ring 30. The ground ring 30 is made of silicon and is grounded. A focus ring 18 is provided on the base 16. The focus ring 18 is made of silicon, and a concave part 19 supporting a peripheral edge of a wafer 22 is provided over an entire inner circumference. A power supply that applies a voltage to stabilize the plasma during the etching is electrically connected to the focus ring. A cover ring 23 that protects a side surface of the focus ring 18 may be provided around the focus ring 18. The cover ring 23 is made of quartz, and a concave part 33 supporting a peripheral edge of the focus ring 18 is provided over an entire inner circumference.

The dry etching apparatus 10 is supplied with the etching gas through the upper electrode plate 14. When the high-frequency voltage is applied from the high-frequency power supply, the plasma is generated between the upper electrode plate 14 and the wafer 22. The surface of the wafer 22 is etched by this plasma.

The ring-shaped member according to the present embodiment is applicable to the focus ring 18, the protection ring 20, the ground ring 30, the side wall member 13, the upper wall member 17, and the baffle plate 25 described above that are silicon components. The ring-shaped member is not limited to the above-described silicon components. The ring-shaped member is applicable to an electrode ring as a silicon component that is placed inside the vacuum chamber 12 of the dry etching apparatus 10 and is supplied with the voltage or is grounded, or a protection member ring that is a silicon component other than the above. The ring-shaped member may have an internal diameter of about 290 mm or more, and an outer diameter of about 800 mm or less.

Figure 2:
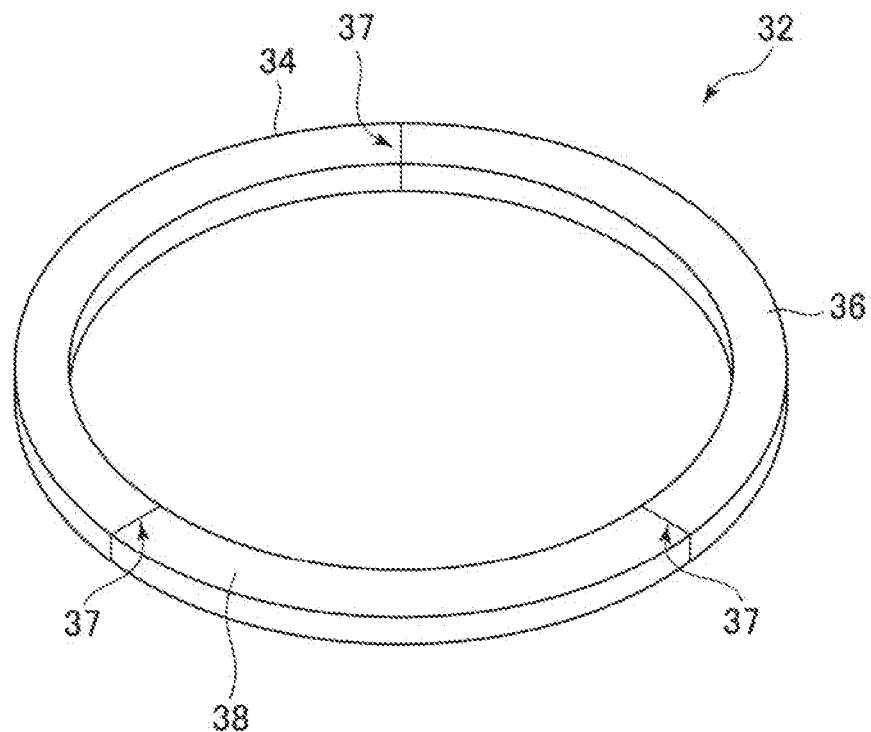
FIG. 2 is a perspective view illustrating the ring-shaped member according to the first embodiment.

As an example, the ring-shaped member according to the present embodiment that serves as the member for the focus ring 18 is described below. As illustrated in FIG. 2, a ring-shaped member 32 includes a plurality of (three in the figure) first silicon members 34, 36, and 38. Note that, in the following description, the plurality of first silicon members 34, 36, and 38 are collectively referred to as silicon members in a case where the plurality of first silicon members 34, 36, and 38 are not particularly distinguished from one another. The silicon members each have an arc shape, and are integrated in a ring shape by being joined in one direction through silicon adhesion parts (not illustrated in the figure) at abutting surfaces 37 that are end surfaces in a longitudinal direction. The silicon members each may be monocrystalline silicon or polycrystalline silicon. A manufacturing method, purity, crystal orientation, etc. thereof are not limited. A size of each of the silicon members is not particularly limited, and for example, each of the silicon members may have a thickness of about 1 mm or more and about 100 mm or less, and a width of about 10 mm or more and about 100 mm or less.

Figure 3:
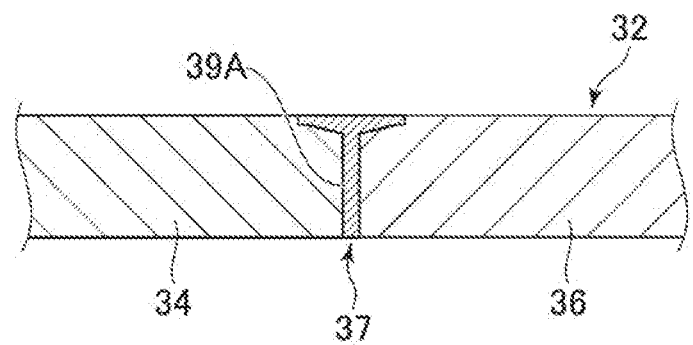
FIG. 3 is a cross-sectional view illustrating an abutting surface according to the first embodiment.

As illustrated in FIG. 3, a silicon adhesion part 39A is provided between the abutting surfaces 37 of the silicon members. FIG. 3 illustrates the abutting surfaces 37 of the first silicon members 34 and 36.

In a case where the silicon members each contain monocrystalline silicon, the monocrystalline silicon that takes over crystallinity of the end surfaces of the silicon members contacted at the abutting surfaces 37 is integrated in the silicon adhesion part 39A. In the figure, in the silicon adhesion part 39A, one silicon adhesion part that is made of monocrystalline silicon taking over the crystallinity of the end surface of the silicon member 34 and the other silicon adhesion part that is made of monocrystalline silicon taking over the crystallinity of the end surface of the silicon member 36 are integrated. In other words, crystal orientation of the one silicon adhesion part is the same as crystal orientation at the end surface of the silicon member 34, and crystal orientation of the other silicon adhesion part is the same as crystal orientation at the end surface of the silicon member 36.

(2) Manufacturing Method

Next, a method of manufacturing the ring-shaped member 32 is described. First, surface treatment is performed on the silicon members. More specifically, surfaces of the silicon members are treated by grinding, polishing, or the like, to preferably form mirror surfaces. The surfaces of the silicon members may be etched by mixed solution of hydrofluoric acid and nitric acid. As the mixed solution, chemical polishing solution (hydrofluoric acid (49%):nitric acid (70%):acetic acid (100%)=3:5:3) standardized as JIS H 0609 may be used.

Subsequently, the three first silicon members 34, 36, and 38 are arranged in the ring shape. The silicon adhesion parts 39A at the abutting surfaces 37 of the first silicon members 34, 36, and 38 are formed by heating and melting silicon near each of the abutting surfaces 37. A gap between the abutting surfaces in the first silicon members 34, 36, and 38 that are arranged in the ring shape is preferably 0 mm to 1 mm. A volume of the silicon is reduced when melted. For example, if the gap between the first silicon members 34 and 36 exceeds 1 mm, silicon melt at the end surface of the first silicon member 34 and silicon melt at the end surface of the first silicon member 36 do not come into contact with each other. Accordingly, a silicon adhesion part at the end surface of the first silicon member 34 and a silicon adhesion part at the end surface of the first silicon member 36 are not integrally joined.

In a case where the gap is equal to or lower than 1 mm, the silicon melt at the end surface of the first silicon member 34 and the silicon melt at the end surface of the first silicon member 36 come into contact with each other due to surface tension, and the silicon melt at the end surface of the first silicon member 34 and the silicon melt at the end surface of the first silicon member 36 flow into the gap due to capillary phenomenon. As a result, the silicon adhesion part at the end surface of the first silicon member 34 and the silicon adhesion part at the end surface of the first silicon member 36 are integrally joined at atomic level.

The heating can be performed through optical heating. In the optical heating, positions to be heated can easily be shifted, and a heating amount can easily be changed according to the supplied power. For example, various kinds of lamps and lasers are used for the optical heating.

Figure 4:
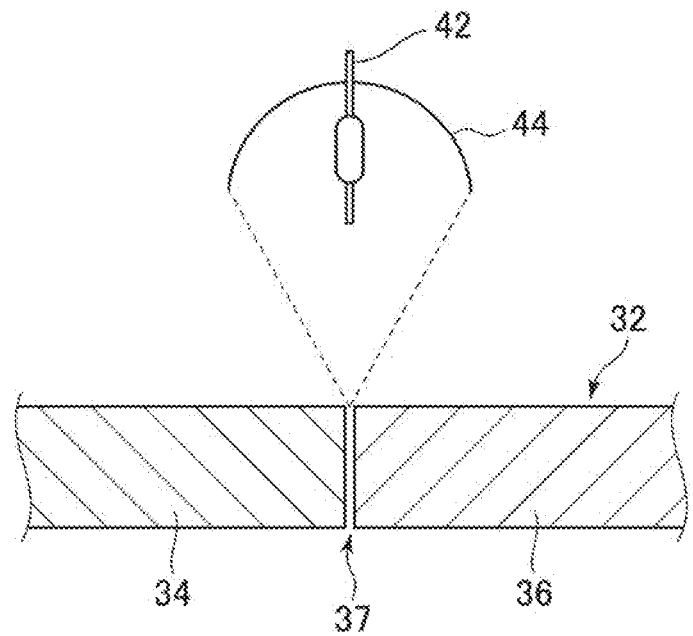
FIG. 4 is a cross-sectional view schematically illustrating an apparatus that manufactures the ring-shaped member.

In the present embodiment, an apparatus illustrated in FIG. 4 is usable. The apparatus illustrated in the figure includes at least one lamp 42 and at least one elliptical mirror 44 serving as a light condensing portion that condenses light emitted from the lamp 42. As the lamp 42, a xenon lamp or a halogen lamp that is commonly used in an infrared crystal growth apparatus is usable. An output of the lamp is preferably about 1 kW to about 30 kW. As the laser, an infrared laser having a wavelength of 780 nm to 1600 nm is usable. Further, in terms of handling easiness and a lifetime of a light source, a package-type light source that is obtained by modularizing a plurality of semiconductor lasers and has a wavelength of 780 nm to 980 nm and an output of about 200W to about 400W is preferably used.

The heating may be performed in an oblique direction without being limited to a direction perpendicular to the silicon members as long as the heating is performed from an outside of the abutting surfaces 37.

A light condensed region normally has a diameter of about 10 mm to about 30 mm. The diameter of the light condensed region is increased to about 30 mm to about 100 mm when a light emission position of the lamp 42 is out of position from a focal point of the elliptical mirror 44. The light condensed region thus expanded makes it possible to expand a heated range. The light condensed region is preferably be moved to scan the entire region of the upper surface of the ring-shaped member 32 corresponding to the abutting surfaces 37, to effect heating.

First, the lamp position is adjusted such that one focal position of the elliptical mirror 44 and a position of a light emission portion of the lamp 42 are coincident with each other, and heights of the upper surfaces of the silicon members are adjusted to the other focal position of the elliptical mirror 44. This adjusts a spread of the elliptical mirror 44 at an irradiation position to about 3 mm. In this state, the elliptical mirror 44 is aligned to the position of the abutting surfaces 37 and the power of the lamp 42 is increased. Once the heating is started, the upper surfaces of the abutting surfaces 37 are melted to generate the silicon melt. More specifically, the upper surfaces start to melt at 60% of lamp rating (surface temperature is estimated to be 1420° C.). At 90% of the lamp rating, silicon at the abutting surfaces 37 is melted and the silicon melt flows into the gap between the abutting surfaces 37 due to capillary phenomenon, to plug a part of the gap between the abutting surfaces 37. In this state, the elliptical mirror 44 is moved to scan along the abutting surfaces 37 at a constant speed, for example, at a speed of 5 mm/minute. As a result, the gap between the abutting surfaces 37 is filled with the silicon melt and is plugged. The elliptical mirror 44 is moved to scan outer edges of the abutting surfaces 37 on the upper surface side of the ring-shaped member 32, to effect heating. In addition, the abutting surfaces 37 on the lower surface side of the ring-shaped member may be heated in a similar manner.

Next, the melted upper surfaces of the abutting surfaces 37 are cooled to crystallize the silicon melt according to crystallinity of the silicon members. More specifically, the power of the lamp 42 is reduced, in two minutes, to 60% of the lamp rating at which the silicon melt starts to be solidified, and the state is maintained for five minutes. The surface temperature at this time is 1400° C. to 1415° C. The silicon melt becomes the silicon adhesion part 39A that takes over the crystallinity of the end surfaces of the silicon members contacted at the abutting surfaces 37. In the case where the silicon members each contain monocrystalline silicon, in the silicon adhesion part 39A, the one silicon adhesion part that is made of monocrystalline silicon taking over the crystallinity of the end surface of the one silicon member and the other silicon adhesion part that is made of monocrystalline silicon taking over the crystallinity of the end surface of the other silicon member are integrated.

The silicon adhesion part 39A is similarly formed at all of the abutting surfaces 37 by the above-described procedure, which makes it possible to join the first silicon members 34, 36, and 38 to form the ring-shaped member 32.

The ring-shaped member 32 obtained in the above-described manner may serve as the focus ring 18 by being provided with a concave part over the entire inner circumference by machining.

The ring-shaped member 32 is manufacturable by combining three or more silicon members that are each cut out from a silicon crystal ingot for wafer having a size smaller than the outer diameter of the silicon component. Accordingly, it is unnecessary for the ring-shaped member 32 to use the silicon crystal ingot for wafer that has a size larger than the outer diameter of the silicon component, which allows for reduction of the cost.

In the ring-shaped member 32 according to the present embodiment, the abutting surfaces 37 are joined by the silicon adhesion part 39A. Even if the ring-shaped member 32 is irradiated with plasma inside the vacuum chamber 12, the inside of the vacuum chamber 12 is not contaminated.

(3) Variation

Figure 5:
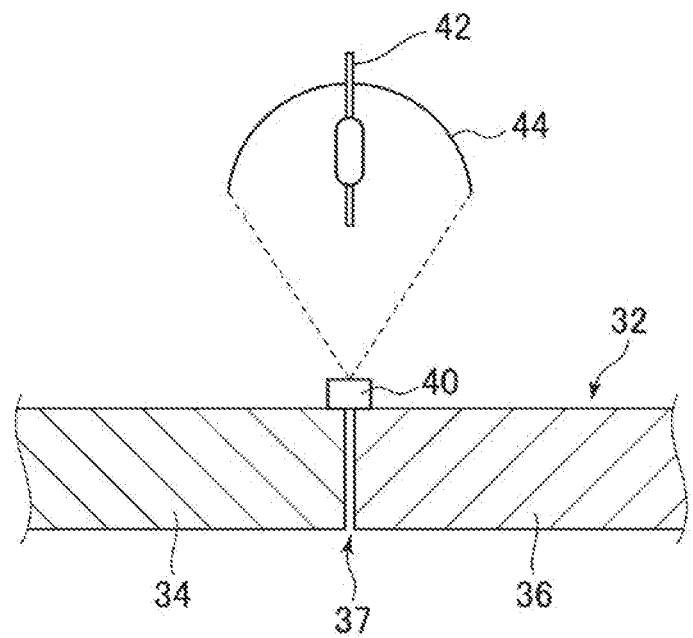
FIG. 5 is a cross-sectional view illustrating a method of manufacturing a ring-shaped member according to a variation of the first embodiment.
Figure 6:
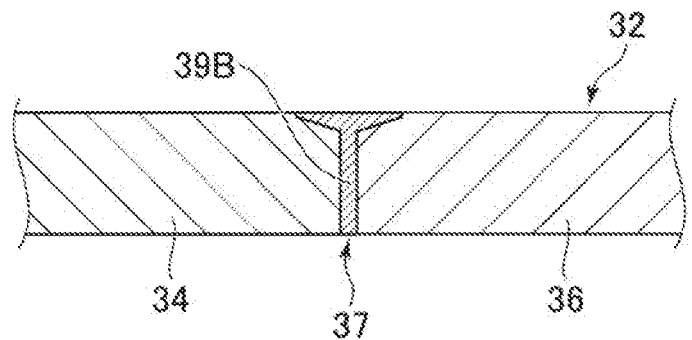
FIG. 6 is a cross-sectional view illustrating a silicon adhesion part manufactured by the manufacturing method according to the variation of the first embodiment.

In the present embodiment, the case where silicon at the end surfaces contacted at the abutting surfaces 37 is melted to form the silicon adhesion part 39A has been described; however, the present invention is not limited thereto. As illustrated in FIG. 5, a monocrystalline or polycrystalline silicon piece 40 may be placed on the abutting surfaces, and the silicon piece 40 may be melted to form a silicon adhesion part 39B. In a case where the silicon piece 40 is not used, silicon on the upper surface side of the abutting surfaces 37 is melted and flows into the gap between the abutting surfaces 37, which may cause a recess on the upper surface side of the abutting surfaces 37. Forming the silicon adhesion part 39B with use of the silicon piece 40 makes it possible to prevent upper surfaces 55 of the abutting surfaces 37 from being recessed after the silicon adhesion part 39B is formed (FIG. 6). The silicon piece 40 preferably has the same volume as the volume of the gap between the abutting surface 37.

2. Second Embodiment

Figure 7:
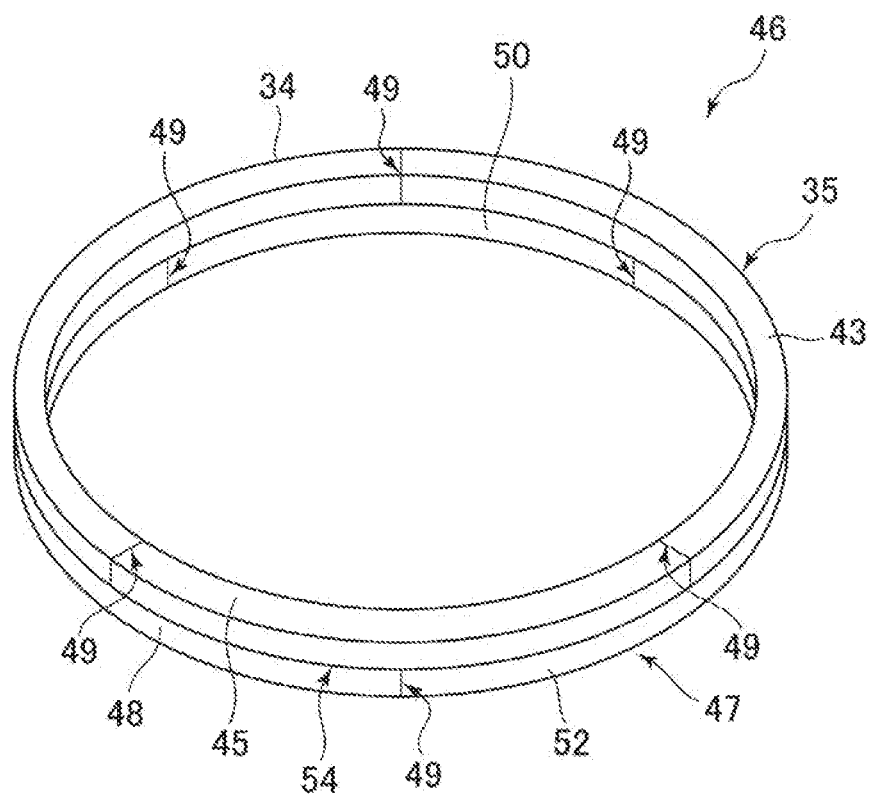
FIG. 7 is a perspective view illustrating a ring-shaped member according to a second embodiment.

Next, a ring-shaped member according to a second embodiment is described. Note that components similar to those in the above-described first embodiment are denoted by similar reference numerals, and description of such components is omitted. A ring-shaped member 46 illustrated in FIG. 7 includes a first ring body 35 and a second ring body 47. The first ring body 35 illustrated in the figure includes first silicon members 41, 43, and 45, and has a width smaller than the width of the ring-shaped member 32 in the above-described first embodiment, as a difference. The second ring body 47 includes a plurality of (three in the figure) second silicon members 48, 50, and 52. The second silicon member 48, 50, and 52 are the same as the first silicon members 41, 43, and 45 even though the reference numerals are changed for convenience of description. The first ring body 35 and the second ring body 47 are coaxially superposed through a joining surface 54 while abutting surfaces 49 of the silicon members of the first ring body are out of position in a circumferential direction from abutting surfaces 49 of the silicon members of the second ring body 47.

Figure 8A:
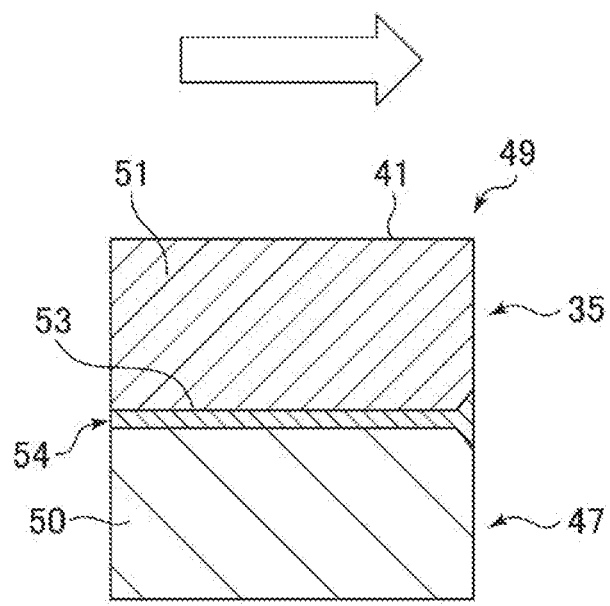
FIG. 8A is an abutting surface in a first ring body.
Figure 8B:
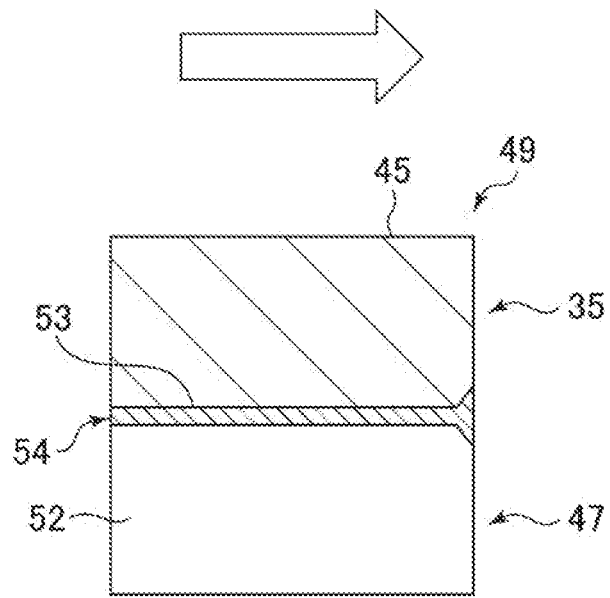
FIG. 8B is an abutting surface in a second ring body.

FIG. 8A illustrates the abutting surfaces 49 the first silicon members 41 and 43, and FIG. 8B illustrates the abutting surfaces 49 of the second silicon members 48 and 52. An arrow direction in the figures indicates an outside direction in a radial direction of the ring-shaped member 46.

A first silicon adhesion part 51 is formed between the abutting surfaces 49 of the first silicon members 41 and 43 (FIG. 8A). A second silicon adhesion part 53 is formed on the joining surface 54 between the first ring body 35 and the second ring body 47. No first silicon adhesion part is provided between the abutting surfaces 49 between the second silicon members 48 and 52 (FIG. 8B).

The first silicon adhesion part 51 plugs each of gaps of the abutting surfaces 49 of the first silicon members 41, 43, and 45, and a gap at the joining surface 54 between the first ring body 35 and the second ring body 47 in this manner.

Next, a method of manufacturing the ring-shaped member 46 according to the present embodiment is described. Note that description of processes similar to those in the above-described first embodiment is omitted if not necessary. The three second silicon members 48, 50, and 52 subjected to the surface treatment are first arranged in a ring shape. Next, the three first silicon members 41, 43, and 45 are placed on upper surfaces of the second silicon members 48, 50, and 52. The first silicon members 41, 43, and 45 are disposed so as to be out of position, by half of a length in a longitudinal direction, from the second silicon members 48, 50, and 52 that have been already disposed. A state where the first silicon members 41, 43, and 45 are stacked on the second silicon members 48, 50, and 52 is established in the above-described manner.

Next, heating is performed from the first silicon members 34, 36, and 38 side, to generate silicon melt in the gaps of the abutting surfaces 49 of the first silicon members 41, 43, and 45, thereby forming the first silicon adhesion parts 51. A heating condition and a cooling condition may be set similarly to the above-described first embodiment.

Subsequently, silicon at the joining surface 54 between the first ring body 35 and the second ring body 47 is heated and melted. The melted silicon flows into the gap at the joining surface 54 in a horizontal direction due to capillary phenomenon, to form the second silicon adhesion part 53.

In the ring-shaped member 46 according to the present embodiment, the abutting surfaces 49 are joined by the first silicon adhesion parts 51, and the joining surface 54 is joined by the second silicon adhesion part 53. This makes it possible to achieve effects similar to those by the above-described first embodiment.

In the present embodiment, the case where the silicon of the end surfaces contacted at the abutting surfaces 49 is melted to form the first silicon adhesion part 51 has been described; however, the present invention is not limited thereto. As illustrated in FIG. 5 described above, the silicon piece 40 may be placed on the abutting surfaces, and the silicon piece 40 may be melted to form the first silicon adhesion part.

In the present embodiment, the case where the width of the ring-shaped member is smaller than the width of the ring-shaped member 32 according to the above-described first embodiment has been described; however, the present invention is not limited thereto. The width of the ring-shaped member may be appropriately selected as long as the first ring body and the second ring body are joined at the joining surface with sufficient mechanical strength.

The case where the first silicon adhesion part is not provided between the abutting surfaces 49 of the second silicon members 48 and 52 has been described; however, the present invention is not limited thereto. The first silicon adhesion part may be provided between the abutting surfaces 49 of the second silicon members 48 and 52.

3. Third Embodiment

Figure 9A:
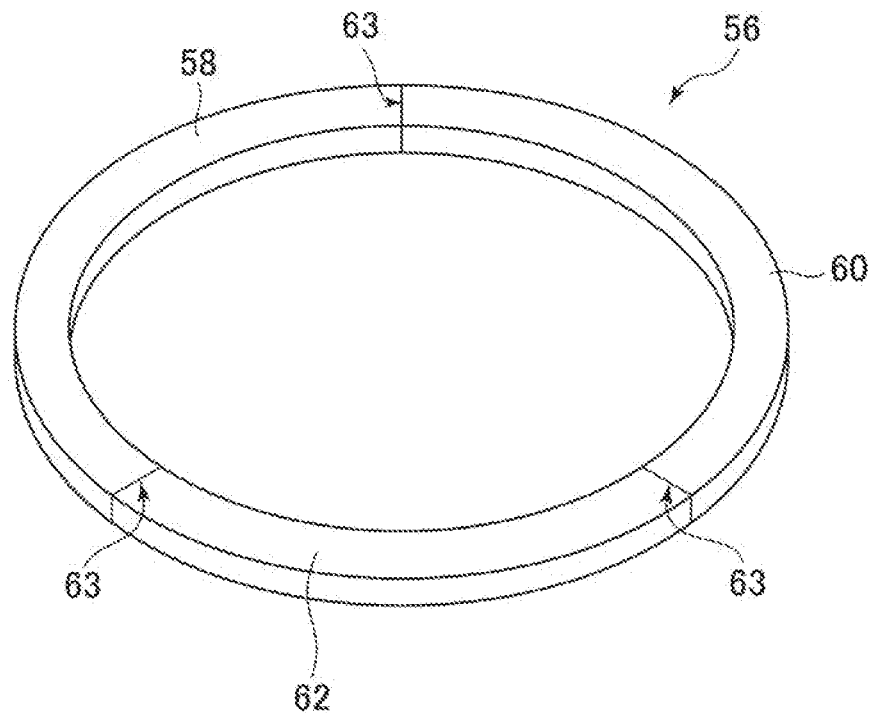
FIG. 9A illustrates upper surface side.
Figure 9B:
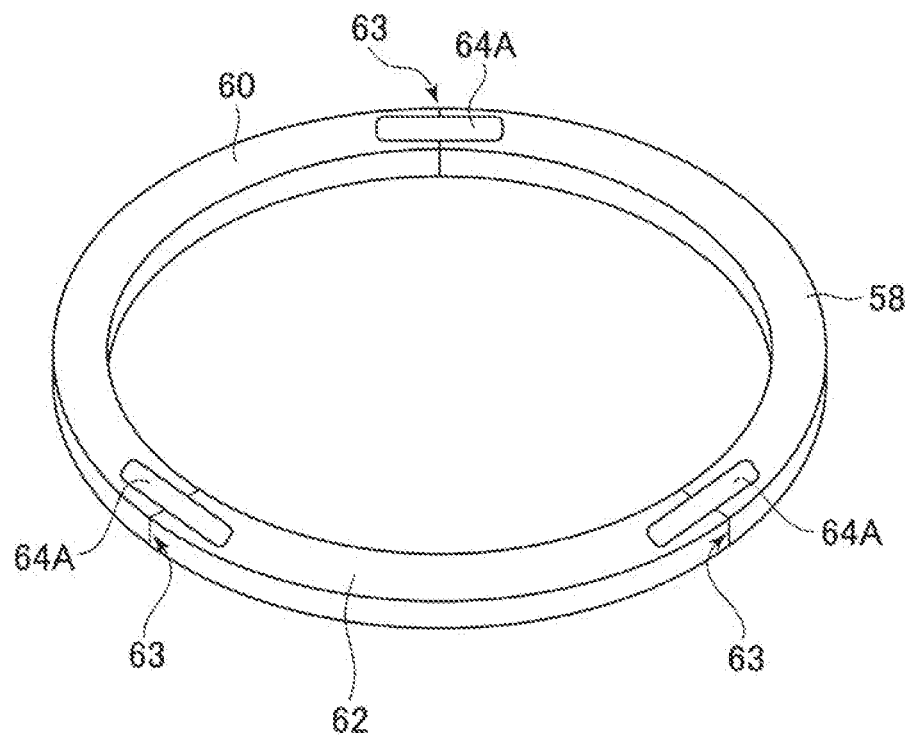
FIG. 9B illustrates lower surface side.

Next, a ring-shaped member according to a third embodiment is described. A ring-shaped member 56 illustrated in FIGS. 9A and 9B includes a plurality of (three in the figures) first silicon members 58, 60, and 62, and a plurality of (three) embedded silicon members 64A that are embedded at positions across two of the first silicon members 58, 60, and 62. The embedded silicon members 64A are provided on side opposite to side of the ring-shaped member 56 irradiated with plasma, that is, lower surface side in the figure.

The embedded silicon members 64A are preferably made of the same material as the silicon members. Four corners of each of the embedded silicon members 64A are preferably processed to be round. The four corners of each of the embedded silicon members 64A are processed to be round. This can help preventing damage such as chipping. The corner radius of each of the corners is preferably 3 mm or more.

Each of the embedded silicon members 64A is preferably formed such that a height of a lower surface is equal to a height of the lower surface of each of the silicon members. A thickness of each of the embedded silicon members 64A is preferably 20% to 80% of the thickness of each of the silicon members, and is more preferably 40% to 60% of the thickness of each of the silicon members.

Each of the embedded silicon members 64A is preferably made of a rectangular plate member, and preferably has a size not protruding from the ring-shaped member 56 in a planar view. A length of each of the embedded silicon members 64A in a longitudinal direction is preferably 2% to 10% of an outer peripheral length of the ring-shaped member 56.

More specifically, the size of each of the silicon members may be a size that is obtained by dividing, into three pieces, a ring having an inner peripheral diameter of 340 mm, an outer peripheral diameter of 420 mm, and a thickness of 4 mm. Each of the embedded silicon members 64A may have 5 mm-rounded four corners, and have a length of 60 mm, a width of 25 mm, and a thickness of 2 mm. Holes formed on the lower surfaces of the silicon members each have a shape corresponding to a shape of a small piece of silicon, and has a depth of 2 mm. In this case, the thickness of each of the embedded silicon members 64A is 50% of the thickness of each of the silicon members, and the length of each of the embedded silicon members 64A in the longitudinal direction is 5% of the outer peripheral length of the ring-shaped member 56.

Figure 10A:
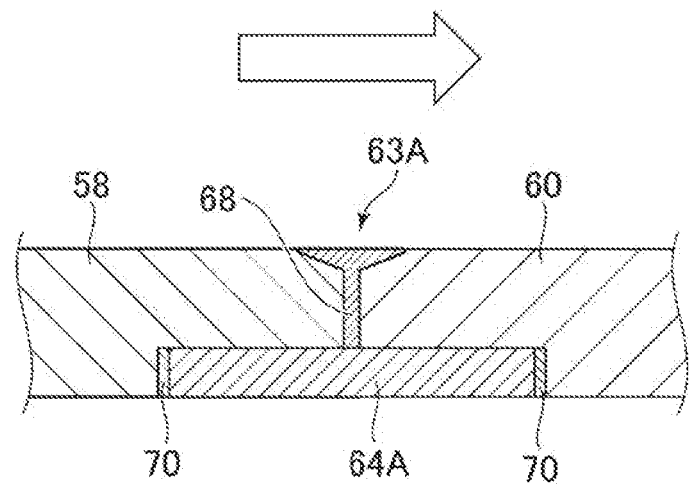
FIG. 10A is a cross-sectional view.
Figure 10B:
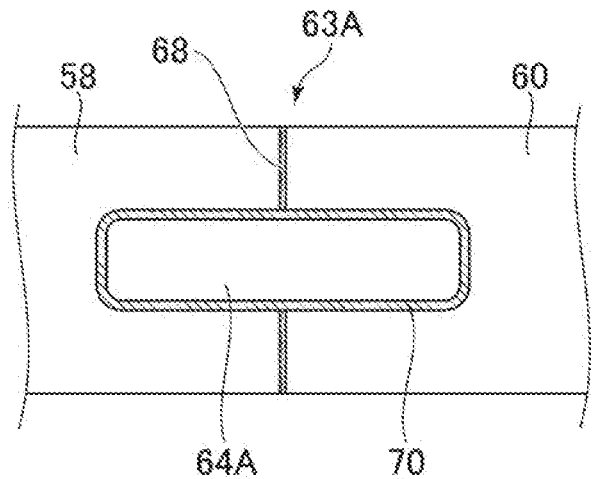
FIG. 10B is a bottom view.

As illustrated in FIGS. 10A and 10B, holes each including a bottom surface are provided at end parts in the longitudinal direction on the lower surfaces of the silicon members. FIGS. 10A and 10B illustrate abutting surfaces 63A of the first silicon members 58 and 60. The embedded silicon members 64A are respectively embedded in the holes. A first silicon adhesion part 68 is provided in each of gaps of the abutting surfaces 63A of the first silicon members 58, 60, and 62. A second silicon adhesion part 70 is provided between a peripheral edge of each of the embedded silicon members 64A and a corresponding hole inner surface of the first silicon members 58, 60, and 62.

The first silicon adhesion part 68 between the abutting surfaces according to the present embodiment is formed in a manner similar to the above-described first embodiment. The second silicon adhesion part 70 is formed by heating, in a manner similar to the above-described first embodiment, silicon on the peripheral edge of each of the embedded silicon members 64A and silicon near the hole inner surface of each of the first silicon members 58, 60, and 62 from the lower surface side of the silicon members, to generate silicon melt.

In the ring-shaped member 56 according to the present embodiment, providing the embedded silicon members 64A makes it possible to increase a joining area between the silicon members. This makes it possible to more increase mechanical strength. Further, in the ring-shaped member 56, the abutting surfaces 63A are joined by the first silicon adhesion part 68. This makes it possible to achieve effects similar to the effects by the above-described first embodiment.

Figure 11A:
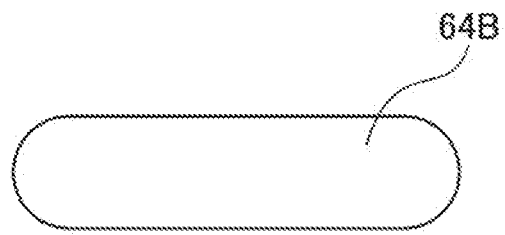
FIG. 11A illustrates a variation (1)
Figure 11B:
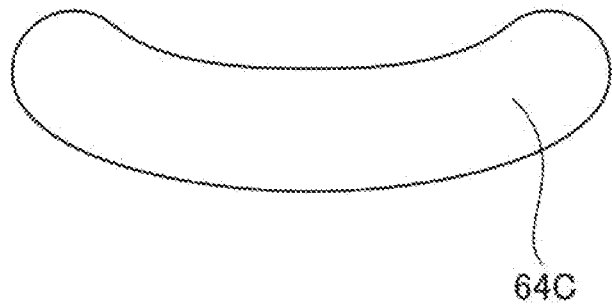
FIG. 11B illustrates a variation (2).

Each of the embedded silicon members 64A does not necessarily have a rectangular shape. For example, as illustrated in FIGS. 11A and 11B, an embedded silicon member 64B having an oval shape (FIG. 11A), or an embedded silicon member 64C having an arc shape (FIG. 11B) may be used. Further, end parts of each of the embedded silicon members 64B and 64C in the longitudinal direction may be each formed in a semicircular shape as illustrated in the figures.

In the present embodiment, the case where silicon of the end surfaces contacted at the abutting surfaces 63A is melted to form the first silicon adhesion part 68 has been described; however, the present invention is not limited thereto. As illustrated in FIG. 5, the silicon piece 40 may be placed on the abutting surfaces, and the silicon piece 40 may be melted to form the first silicon adhesion part.

REFERENCE SIGNS LIST

12 Vacuum chamber (process chamber)
22 Wafer (substrate)
32 Ring-shaped member
34, 36, 38 First silicon member (silicon member)
37 Abutting surface
39A, 39B Silicon adhesion part
41, 43, 45 First silicon member (silicon member)
48, 50, 52 Second silicon member (silicon member)
49 Abutting surface
51 First silicon adhesion part (silicon adhesion part)
53 Second silicon adhesion part (silicon adhesion part)
58, 60, 62 First silicon member (silicon member)
63A Abutting surface
64A, 64B, 64C Embedded silicon member
68 First silicon adhesion part (silicon adhesion part)
70 Second silicon adhesion part (silicon adhesion part)

The invention claimed is:

1. A method of manufacturing a ring-shaped member to be placed in a process chamber of a substrate processing apparatus that performs plasma processing on a substrate accommodated in the process chamber, the method comprising:

arranging one silicon member and another silicon member to cause one abutting surface of the one silicon member and another abutting surface of the other silicon member to abut on each other;

heating the one abutting surface and the other abutting surface through optical heating by a xenon lamp or a halogen lamp to melt silicon on a surface of the one abutting surface and silicon on a surface of the other abutting surface such that silicon melt is caused to flow into a gap between the one abutting surface and the other abutting surface; and cooling the one abutting surface and the other abutting surface to crystallize the silicon melt forming a silicon adhesion part such that the one silicon member and the other silicon member are joined to each other with the silicon adhesion part.

2. A method of manufacturing a ring-shaped member to be placed in a process chamber of a substrate processing apparatus that performs plasma processing on a substrate accommodated in the process chamber, the method comprising:

arranging one silicon member and another silicon member to cause one abutting surface of the one silicon member and another abutting surface of the other silicon member to abut on each other through a gap;

heating the one abutting surface and the other abutting surface through optical heating to melt silicon on a surface of the one abutting surface and silicon on a surface of the other abutting surface to come into contact with each other such that silicon melt is caused to flow into the gap between the one abutting surface and the other abutting surface by capillary phenomenon; and cooling the one abutting surface and the other abutting surface to crystallize the silicon melt forming a silicon adhesion part such that the one silicon member and the other silicon member are joined to each other with the silicon adhesion part.

3. The method of manufacturing the ring-shaped member according to claim 2, wherein the optical heating is performed by a xenon lamp or a halogen lamp.

* * * * *